(12) United States Patent
Ikeda

(10) Patent No.: US 7,773,712 B2
(45) Date of Patent: Aug. 10, 2010

(54) CLOCK SWITCHING CIRCUIT

(75) Inventor: Akimitsu Ikeda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 495 days.

(21) Appl. No.: 11/822,328

(22) Filed: Jul. 5, 2007

(65) Prior Publication Data
US 2008/0008282 A1  Jan. 10, 2008

(30) Foreign Application Priority Data
Jul. 6, 2006  (JP) .............................. 2006-186619

(51) Int. Cl.
*H04L 7/00* (2006.01)
(52) U.S. Cl. .................................................. 375/371
(58) Field of Classification Search .................. 375/354, 375/371; 370/304, 503, 516
See application file for complete search history.

(56) References Cited

U.S. PATENT DOCUMENTS

| | | | | |
|---|---|---|---|---|
| 5,920,600 A * | 7/1999 | Yamaoka et al. | ............ | 375/376 |
| 6,384,649 B1 * | 5/2002 | Boerstler et al. | ............ | 327/156 |
| 7,010,074 B2 * | 3/2006 | Nakamura | ............ | 375/371 |
| 7,183,831 B2 * | 2/2007 | Ikeda | ............ | 327/298 |
| 7,187,727 B2 * | 3/2007 | Saeki | ............ | 375/327 |
| 2003/0132783 A1 * | 7/2003 | Natsume | ............ | 327/1 |
| 2005/0285636 A1 * | 12/2005 | Ikeda | ............ | 327/99 |
| 2006/0006909 A1 * | 1/2006 | Morigaki | ............ | 327/1 |
| 2006/0245532 A1 * | 11/2006 | Ziesler | ............ | 375/376 |
| 2007/0177700 A1 * | 8/2007 | Saeki | ............ | 375/371 |

FOREIGN PATENT DOCUMENTS

| | | |
|---|---|---|
| JP | 2001-056918 A | 2/2001 |
| JP | 2006-011704 A | 1/2006 |

* cited by examiner

*Primary Examiner*—Khanh C Tran
(74) *Attorney, Agent, or Firm*—Arent Fox LLP

(57) ABSTRACT

A clock switching circuit in which one clock signal is selected from $2^N$-phase input clock signals with the same frequency but with each shifted in phase (where N is an integer equal to or greater than 3), based on N-bit selection signals, and is output as an output clock signal, comprises a selector group having $2^N-1$ selectors each of which select and output one clock signal from two input clock signals, and an operation control circuit which generates $2^N-1$ operation control signals to execute control to set the $2^N-1$ selectors into an active state or into a sleep state. The selectors select the clock signals based on the selection signals. The operation control circuit executes control to set a portion of the selectors among the $2^N-1$ selectors to the active state and to set the remaining selectors to the sleep state, based on the selection signals.

17 Claims, 14 Drawing Sheets

FIG.3 PRIOR ART

| INPUT CLOCK: SELECTION SIGNAL | SELECTOR |
|---|---|
| ICLK1   000 | |
| ↕ | S1 |
| ICLK2   001 | |
| ↕ | S5 |
| ICLK3   011 | |
| ↕ | S2 |
| ICLK4   010 | |
| ↕ | S7 |
| ICLK5   110 | |
| ↕ | S3 |
| ICLK6   111 | |
| ↕ | S6 |
| ICLK7   101 | |
| ↕ | S4 |
| ICLK8   100 | |
| ↕ | S7 |
| ICLK1   000 | |

PRIORART
FIG.6
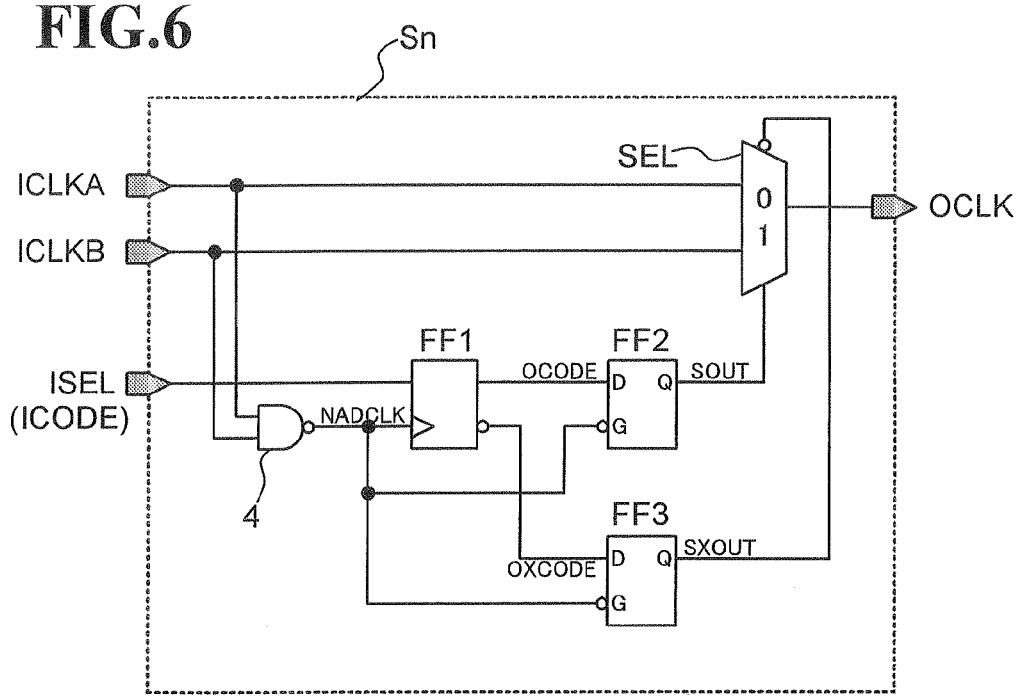

SEL SELECTOR CIRCUIT

FIG.13

| SELECTED CLOCK | ICODE[2:0] | OPERATION (A)/POWER-DOWN (S) | | | | | | | OPERATING RATIO |
|---|---|---|---|---|---|---|---|---|---|
| | | S7 | S6 | S5 | S4 | S3 | S2 | S1 | |
| ICLK1 | 000 | A | S | S | S | S | S | A | 2/7 |
| ICLK2 | 001 | S | S | A | S | S | S | A | 2/7 |
| ICLK3 | 011 | S | S | A | S | S | A | S | 2/7 |
| ICLK4 | 010 | A | S | S | S | S | A | S | 2/7 |
| ICLK5 | 110 | A | S | S | S | A | S | S | 2/7 |
| ICLK6 | 111 | S | A | S | S | A | S | S | 2/7 |
| ICLK7 | 101 | S | A | S | A | S | S | S | 2/7 |
| ICLK8 | 100 | A | S | S | A | S | S | S | 2/7 |

FIG.14

| SELECTED CLOCK | ICODE[2:0] | OPERATION (A)/POWER-DOWN (S) | | | | | | | OPERATING RATIO |
|---|---|---|---|---|---|---|---|---|---|
| | | S7 | S6 | S5 | S4 | S3 | S2 | S1 | |
| ICLK1 | 000 | A | A | A | A | S | S | A | 5/7 |
| ICLK2 | 001 | S | S | A | S | S | A | A | 3/7 |
| ICLK3 | 011 | S | S | A | S | S | A | A | 3/7 |
| ICLK4 | 010 | A | A | A | S | A | A | S | 5/7 |
| ICLK5 | 110 | A | A | A | S | A | A | S | 5/7 |
| ICLK6 | 111 | S | A | S | A | A | S | S | 3/7 |
| ICLK7 | 101 | S | A | S | A | A | S | S | 3/7 |
| ICLK8 | 100 | A | A | A | A | S | S | A | 5/7 |

FIG.16

| INPUT CLOCK: SELECTION SIGNAL | SELECTOR |
|---|---|
| ICLK1   0000 | S15 |
| ↕ | S1 |
| ICLK2   0001 | |
| ↕ | S9 |
| ICLK3   0011 | |
| ↕ | S2 |
| ICLK4   0010 | |
| ↕ | S13 |
| ICLK5   0110 | |
| ↕ | S3 |
| ICLK6   0111 | |
| ↕ | S10 |
| ICLK7   0101 | |
| ↕ | S4 |
| ICLK8   0100 | |
| ↕ | S15 |
| ICLK9   1000 | |
| ↕ | S5 |
| ICLK10   1001 | |
| ↕ | S11 |
| ICLK11   1011 | |
| ↕ | S6 |
| ICLK12   1010 | |
| ↕ | S14 |
| ICLK13   1110 | |
| ↕ | S7 |
| ICLK14   1111 | |
| ↕ | S12 |
| ICLK15   1110 | |
| ↕ | S8 |
| ICLK16   1111 | S15 |

CLOCK SWITCHING CIRCUIT

CROSS-REFERENCE TO RELATED APPLICATIONS

This application is based upon and claims the benefit of priority from the prior Japanese Patent Application No. 2006-186619, filed on Jul. 6, 2006, the entire contents of which are incorporated herein by reference.

BACKGROUND OF THE INVENTION

1. Field of the Invention

This invention relates to a clock switching circuit which performs switching of multiple-phase clock signals, and in particular relates to a clock switching circuit which enables reduction of power consumption.

2. Description of the Related Art

A clock switching circuit of this invention selects one clock signal from a plurality of clock signals of the same frequency with different phases, and, by repeated switching to the adjacent-phase clock signal, selects a desired clock signal. In the receivers of communication systems and the data reproduction devices of hard disk drives, one clock signal is selected from a plurality of clock signals at the same frequency but having different phases, and the selected clock signal is used as the sampling clock signal in data sampling. For example, in Japanese Patent Laid-open No. 2001-56918, selection of and switching to a clock signal synchronized with the timing of a data pulse, from among multiple-phase clock signals, is disclosed.

A clock switching circuit has been proposed in which, in clock switching, by repeatedly switching to the adjacent-phase clock signal, the clock signal of the desired phase is selected. For example, such a circuit is disclosed in Japanese Patent Laid-open No. 2006-11704. In this clock switching circuit, when selecting one clock phase out of eight-phase clock, three layers of two-clock selectors are arranged in tournament form, and the selectors in each layer are controlled by three-bit selection signals. That is, four two-clock selectors to each of which clocks are input are provided in the first layer, two two-clock selectors to which the selector output of the first layer are input are provided in the second layer, and one two-clock selector to which the selector output of the second layer are input is provided in the third layer.

By using Gray codes for these selection signals, only one bit among the three-bit selection signals changes, and so switching to the adjacent-phase signal is possible. When switching the clock signal, only one bit is changed in the three-bit selection signals (from 0 to 1 or from 1 to 0), so that the problem of skew between selection signals can be resolved, and the occurrence of glitches in the output clock during clock switching is prevented.

In each selector is provided a flip-flop circuit which latches the selection signal in the interval in which two input clock signals are at the same level (H level or L level), and one of the input clock signals is selected according to the output of the flip-flop circuit. Hence selectors in the clock switching circuit perform switching in intervals in which the two input clock signals are at the same level, so that there is no fluctuation in the output clock level, and glitches do not occur.

SUMMARY OF THE INVENTION

However, the clock switching circuit disclosed in Japanese Patent Laid-open No. 2006-11704 is always in a state in which the flip-flop circuits of all selectors are operating continuously, and so upon each selection signal switching an operation is performed in which the flip-flop circuits latch the selection signal and the selectors are switched, and power necessary for this operation is consumed. In the case of an eight-phase clock signals, seven selectors all perform switching operations upon each selection signal switching, and for a 16-phase clock signals, 15 selectors all perform switching operations upon each selection signal switching; for a $2^N$-phase clock signals, $2^N-1$ selectors all operate upon each selection signal switching. In this case, it may not be necessary for all the selectors to perform switching operations, and it is desirable that this unnecessary power consumption be avoided.

Hence an object of this invention is to provide a clock switching circuit in which power consumption is suppressed.

In order to attain the above object, according to a first aspect of the invention, a clock switching circuit in which one clock signal is selected from $2^N$-phase input clock signals with the same frequency but with each shifted in phase (where N is an integer equal to or greater than 3), based on N-bit selection signals, and is output as an output clock signal, comprises a selector group having $2^N-1$ selectors each of which select and output one clock signal from two input clock signals, and an operation control circuit which generates $2^N-1$ operation control signals to execute control to set the $2^N-1$ selectors into an active state or into a sleep state. The selectors select the clock signals based on the selection signals. The operation control circuit executes control to set a portion of the selectors among the $2^N-1$ selectors to the active state and to set the remaining selectors to the sleep state, based on the selection signals.

In order to attain the above object, according to a second aspect of the invention, a clock switching circuit selects and outputs as the output clock one from among $2^N$-phase input clock signals with the same frequency but with each shifted in phase (where N is an integer equal to or greater than 3), based on an N-bit selection signal. This clock switching circuit has a selector group, having $2^N-1$ selectors each of which selects one clock signal from among two input clock signals, and an operation control circuit which generates $2^N-1$ operation control signals executing control to set the $2^N-1$ selectors into an active state or into a sleep state.

The selector group has a first layer, having the first to $2^{N-1}$-th selectors, each of which select and output one clock signal among two input clock signals among the input clock signals; a second layer, having the $2^{N-1}-1$th to $2^{N-1}+2^{N-2}$th selectors, each of which input the output clock signals of the two selectors in the first layer, and select and output one clock signal among the two; and similarly, third to Nth layers (in this case, N is 4 or greater), where the Nth layer has the $2^N-1$th selector which input the output clock signals of the two selectors in the N−1th layer and selects and outputs one of the clock signals among the two.

The first selection signal is supplied to the first layer selectors using positive logic or negative logic; the second selection signal is supplied to the second layer selectors using positive logic or negative logic, similarly, the third to the N−1th selection signals are supplied to the third to the N−1th layer using positive logic or negative logic; and the Nth selection signal is supplied to the Nth layer selector.

Further, based on the N-bit selection signals, the operation control circuit generates operation control signals which set a portion of the selectors among the $2^N-1$ selectors to the active state, and set the remaining selectors to the sleep state.

By means of the above-described first or second aspect of the invention, the portion of the selectors among the $2^N-1$ selectors necessary for switching to the adjacent clock are set to the active state, and the remaining selectors are set to the sleep state, so that power consumption can be reduced.

In a preferred mode of the above second aspect, the operation control circuit generates active-state operation control signals for at least two selectors necessary for switching to the selected input clock from two adjacent input clocks, among the N selectors in the N layers which are provided from the input terminal of the selected input clock to the output terminal of the output clock.

In a preferred form of the above second mode, the operation control circuit generates active-state operation control signals for, at least, the selectors in the N layers which are provided from the input terminal of the selected input clock to the output terminal of the output clock, and the selectors in the N layers which are provided from the input terminals of input clocks, which are adjacent next-selection candidates to which switching is possible from the selected input clock, to the output terminals of the output clocks.

In a preferred form of the above second aspect, the operation control circuit generates active-state operation control signals at least, for, the two selectors necessary for switching from the two adjacent input clocks to the selected input clock, and the selectors in the N layers provided from the input terminals of input clocks, which are adjacent next-selection candidates to which switching is possible from the selected input clock, to the output terminals of the output clocks, among the selectors in the N layers provided from the input terminal of the selected input clock to the output terminal of the output clock.

By means of this invention, in a clock switching circuit which selects a clock signal among N-phases input clock signals by switching to an adjacent clock signal in order, only selectors necessary for clock switching are made active among the $2^N-1$ selectors arranged in tournament form, and the remaining selectors are set in a sleep state, so that reduction of power consumption is possible.

BRIEF DESCRIPTION OF THE DRAWINGS

FIG. 3 is a table showing the relation between input clock signals, selection signals which select input clock signals, and selectors which contribute to switching during input clock switching;

FIG. 6 shows another selector configuration in a clock switching circuit;

FIG. 13 is a table showing the relation between selection signals and selector operation states in the clock switching circuit of the present embodiment;

FIG. 14 is another table showing the relation between selection signals and selector operation states in the clock switching circuit of the present embodiment;

FIG. 16 is a table indicating the input clocks, selection signals, and the selectors which at a minimum are necessary for switching corresponding to the selection signals, in the clock switching circuit of FIG. 15.

DESCRIPTION OF THE PREFERRED EMBODIMENTS

Below, embodiments of the invention are explained based on the drawings. However, the technical scope of the invention is not limited to these embodiments, but extends to the inventions described in the scope of claims, and to inventions equivalent thereto.

Figure 1:
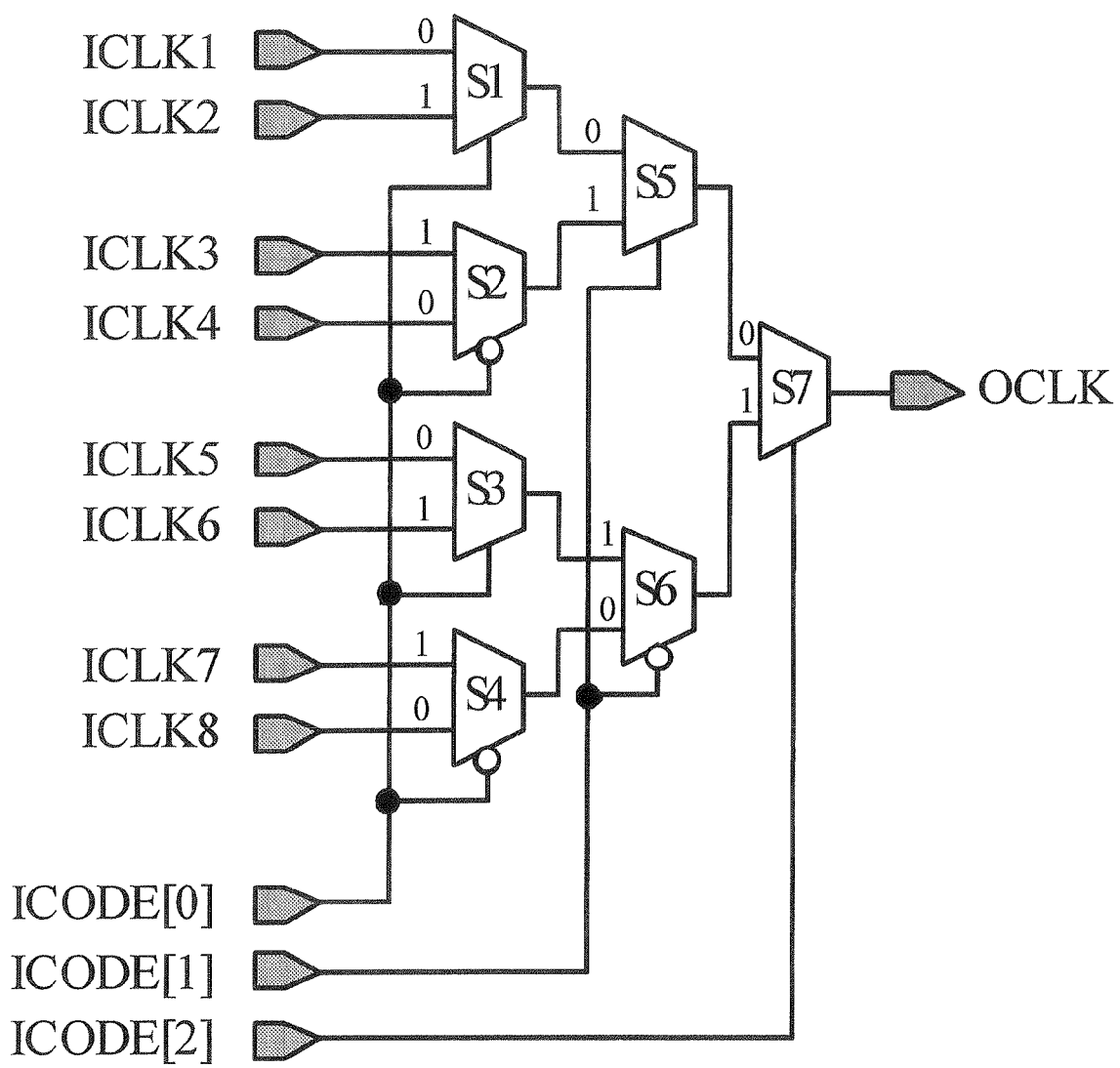
FIG. 1 is a diagram of the clock switching circuit disclosed in Japanese Patent Laid-open No. 2006-11704, which is prior art for the present embodiment.

FIG. 1 is the clock switching circuit disclosed in Japanese Patent Laid-open No. 2006-11704, which is prior art for this embodiment. This clock switching circuit selects, and outputs as the output clock OCLK, one among input clocks with eight-phases ICLK1 to ICLK8. The clock switching circuit has a first layer, comprising four selectors S1 to S4 each of which selects one of two adjacent input clocks among the input clocks with eight-phases ICLK1 to ICLK8; a second layer, comprising two selectors S5, S6 each of which selects one of two adjacent output clocks from the selectors S1 to S4; and a third layer, comprising a selector S7 which selects one among the two output clocks from the selectors S5, S6. Three-bit selection signals ICODE[0] to [2] are supplied for clock selection; the signal ICODE[0] of the lowermost bit is supplied to the first layer selectors S1 to S4, the selection signal ICODE[1] is supplied to the second layer selectors S5, S6, and the uppermost selection signal ICODE[2] is supplied to the third layer selector S7.

Figure 2:
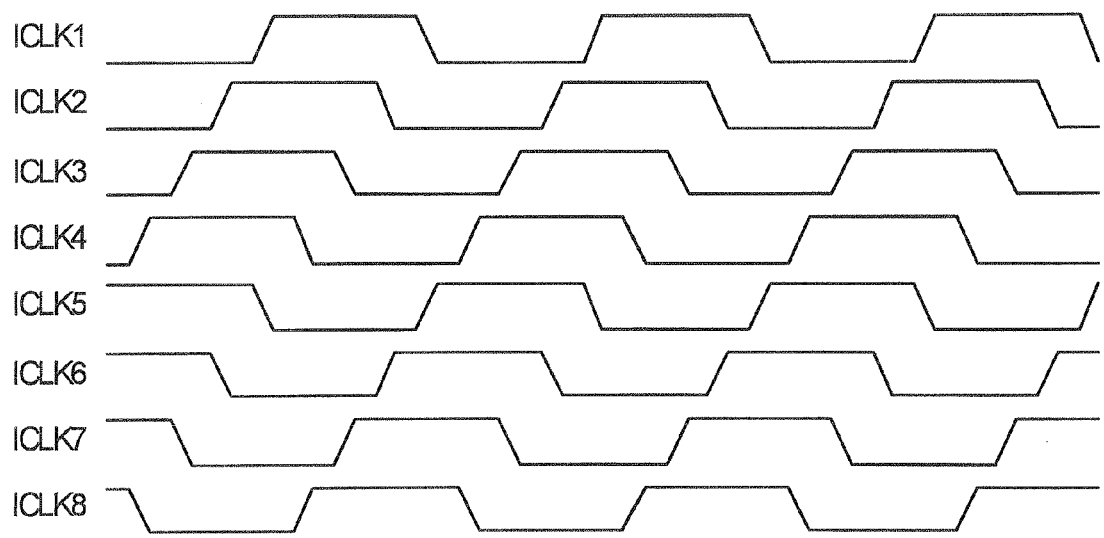
FIG. 2 shows signal waveforms for input clocks ICLK1 to 8 in eight layers.

FIG. 2 shows signal waveforms for input clock signals ICLK1 to ICLK8 with eight phases. The eight input clock signals have the same frequency, but each has a different phase. That is, the eight input clock signals have phase difference that is given by equally dividing one complete cycle (360°) by eight, with the clock signal ICLK8 having the most advanced phase, and clock signal ICLK1 having the phase which lags the most. The clock switching circuit of FIG. 1 switches, among these input clock signals with eight-phases, from the currently selected input clock signal to one of the two adjacent input clock signals. At this time of this clock switching, only one of the bits of three-bit selection signals ICODE[2:0] is switched, and a selector in the corresponding layer is switched according to this, thereby switching to one of the two adjacent input clock signals. By this means, at the time of clock switching it is sufficient for only one bit of the selection signal to be switched from 0 to 1 or from 1 to 0, so that the occurrence of skew due to the selection signal need not be considered. Further, among the three selectors on the route from the input clock input terminal to the output terminal, only one selector performs switching operation, so that glitches do not occur in the output clock. Thereinafter, a signal "0" means a low level, and a signal "1" means a high level.

Returning to FIG. 1, in order to enable switching to one of the adjacent input clocks by switching one bit of the selection signal as described above, the corresponding selection signal is supplied using positive logic to the odd-numbered selectors S1, S3, S5, S7, and the corresponding selection signal is supplied using negative logic to the even-numbered selectors S2, S4, S6.

FIG. 3 is a table showing the relation between input clock signals, selection signals which select input clock signals, and selectors which contribute to switching during input clock switching. As shown in this table, the selection signals ICODE[2:0] comprise Gray codes corresponding to the input clocks ICLK1 to 8. That is, the selection signals ICODE[2:0] which select input clocks ICLK1 to 8 are "000", "001", "011", "010", "110", "111", "101", "100", and switching to an adjacent input clock signal is possible simply by switching one of the bits of the three-bit selection signals. For example, in order to switch from an input clock ICLK2 to ICLK1 or to ICKL3, from the selection signal "001", either the LSB is switched to "0" to obtain "000" (to switch to ICLK1), or the second bit is switched to "1" to obtain "011" (to switch to ICLK3).

In FIG. 1, selection signals "0" or "1" to select one of the eight input clocks ICLK1 to 8 are indicated at the two input terminals of the respective selectors. As is clear from this, switching to an adjacent input clock ICLK1 to 8 is executed through switching by the selectors indicated in the right-hand column in FIG. 3. For example, switching from clock ICLK1 to ICLK2 is performed by switching of selector S1, and switching by other selectors does not have an effect. Switching between other clocks is similarly performed through switching by the selectors indicated in the right-hand column in FIG. 3.

Figure 4:
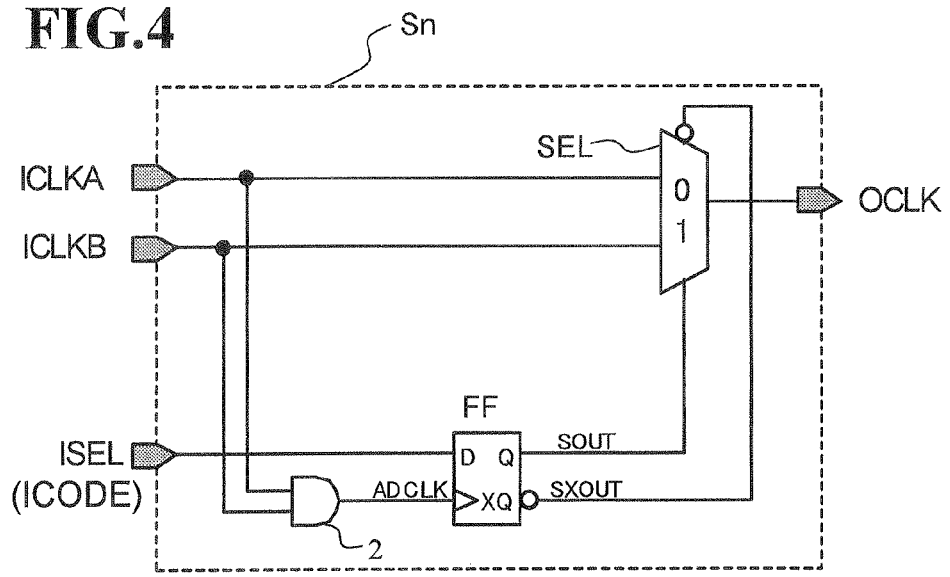
FIG. 4 shows the configuration of a selector in a clock switching circuit.

FIG. 4 shows the configuration of a selector in a clock switching circuit. The clock selection signals ICODE[2:0] are switched asynchronously with the input clocks. Hence when a selection signal is switched at a time at which the two clocks CLKA, B input to a selector are at different levels, glitches may occur in the clock signal OCLK output from the selector, which is undesirable. Hence the selector Sn in FIG. 4 is provided with an AND gate 2 which detects when the two clocks ICLKA, ICLKB are at the same level, for example H level, and a switching control circuit comprising a flip-flop FF which latches the selection signal ISEL in response to the rising edge of the output ADCLK from the AND gate 2; the selector circuit SEL performs clock switching in response to switching of the complementary clock signals SOUT, SXOUT of the flip-flop FF. Hence in place of the AND gate 2 a NOR gate may be provided, so that the flip-flop FF latches the selection signal ISEL when both of the two clocks ICLKA, ICLKB are at L level.

Figure 5:
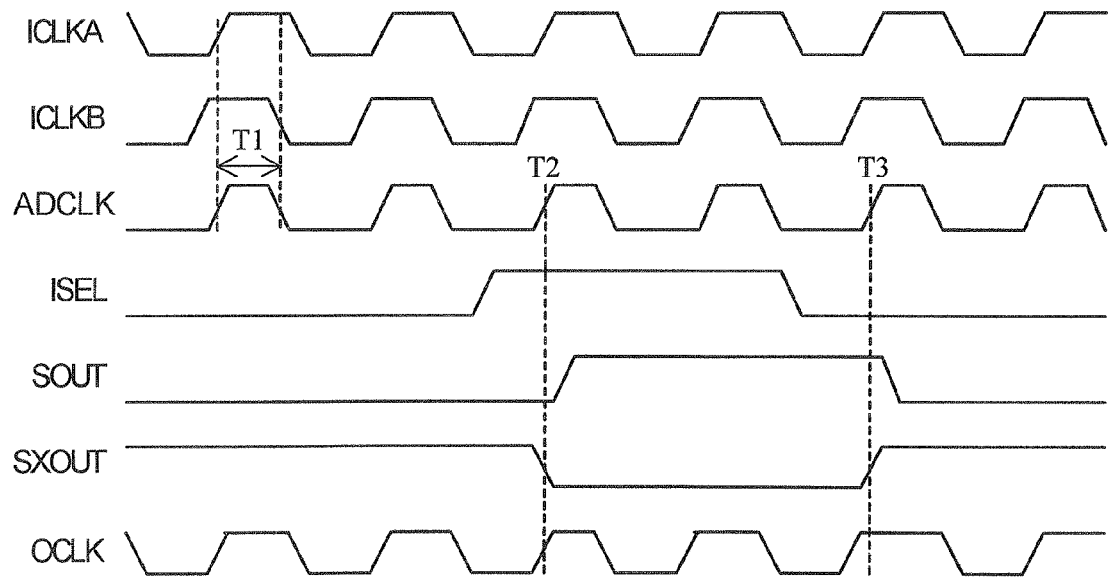
FIG. 5 is an operation waveform diagram for the selector of FIG. 4.

FIG. 5 shows operation waveforms for the selector of FIG. 4. The AND gate 2 outputs a clock signal ADCLK which is at H level during the interval T1 in which both of the two clock signals ICLKA and ICLKB are at H level. In response to the rising edge (T2) of this signal ADCLK, the flip-flop circuit FF latches the H level of the selection signal ISEL and switches the outputs SOUT, SXOUT, and in response to this the selector circuit SEL switches the selected clock. Similarly at the rising edge (T3) of the signal ADCLK, the L level of the selection signal ISEL is latched by the flip-flop circuit FF, the outputs SOUT, SXOUT are switched, and in response this the selector circuit SEL switches the selected clock.

In this way, the selector Sn selects one of the two clock signals with adjacent phases, so that the interval over which the two clock signals are at the same level is long. This fact is utilized to employ the timing with which both clocks are at the same level as a trigger to perform switching between two clock signals. By this means, switching between clocks can be performed with an adequate margin, regardless of the timing of switching of the selection signal, so that the occurrence of glitches or similar in the output clock signal is avoided.

FIG. 6 shows another selector configuration in a clock switching circuit. In this selector, differing from the selector of FIG. 4, a NAND gate 4 is provided in place of the AND gate 2 as the switching control circuit; also present are a flip-flop circuit FF1 which latches the selection signal ISEL at the rising edge of the output clock NADCLK of this NAND gate 4, and flip-flop circuits FF2, FF3 which latch the output of the flip-flop FF1 at the falling edge of the output clock NADCLK. That is, the latching operation is in two stages.

Figure 7:
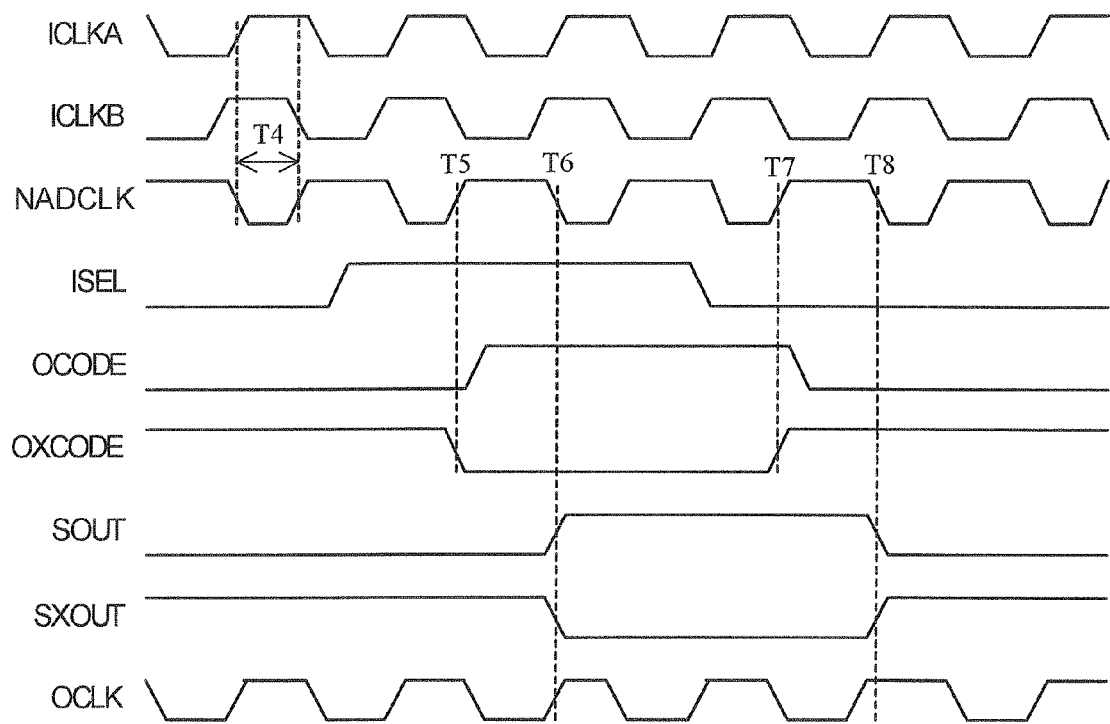
FIG. 7 is an operation waveform diagram for the selector of FIG. 6.

FIG. 7 is an operation waveform diagram for the selector of FIG. 6. The NAND gate 4 outputs a clock signal NADCLK which is at L level during the interval T4 in which both of the two clocks ICLKA, ICLKB are at H level. In response to the rising edge (T5) of this clock signal NADCLK, the flip-flop circuit FF1 latches the selection signal ISEL at H level, and in response to the falling edge (T6) of the clock signal NADCLK, the flip-flop circuits FF2, FF3 latch the outputs OCODE, OXCODE respectively of the flip-flop circuit FF1. By this means, even when there is a time difference in the changes of the two outputs of the flip-flop circuit FF1, the timing of switching of the two signals SOUT, SXOUT supplied to the selector circuit SEL can be made the same.

Similarly, in response to the rising edge (T7) of the clock signal NADCLK, the flip-flop circuit FF1 latches the L level of the selection signal ISEL, and in response to the falling edge (T8) of the clock signal NADCLK, the flip-flop circuits FF2, FF3 latch the outputs OCODE, OXCODE respectively of flip-flop circuit FF1. In this case also, the timing of switching of the two signals SOUT, SXOUT supplied to the selector circuit SEL is the same.

Figure 8:
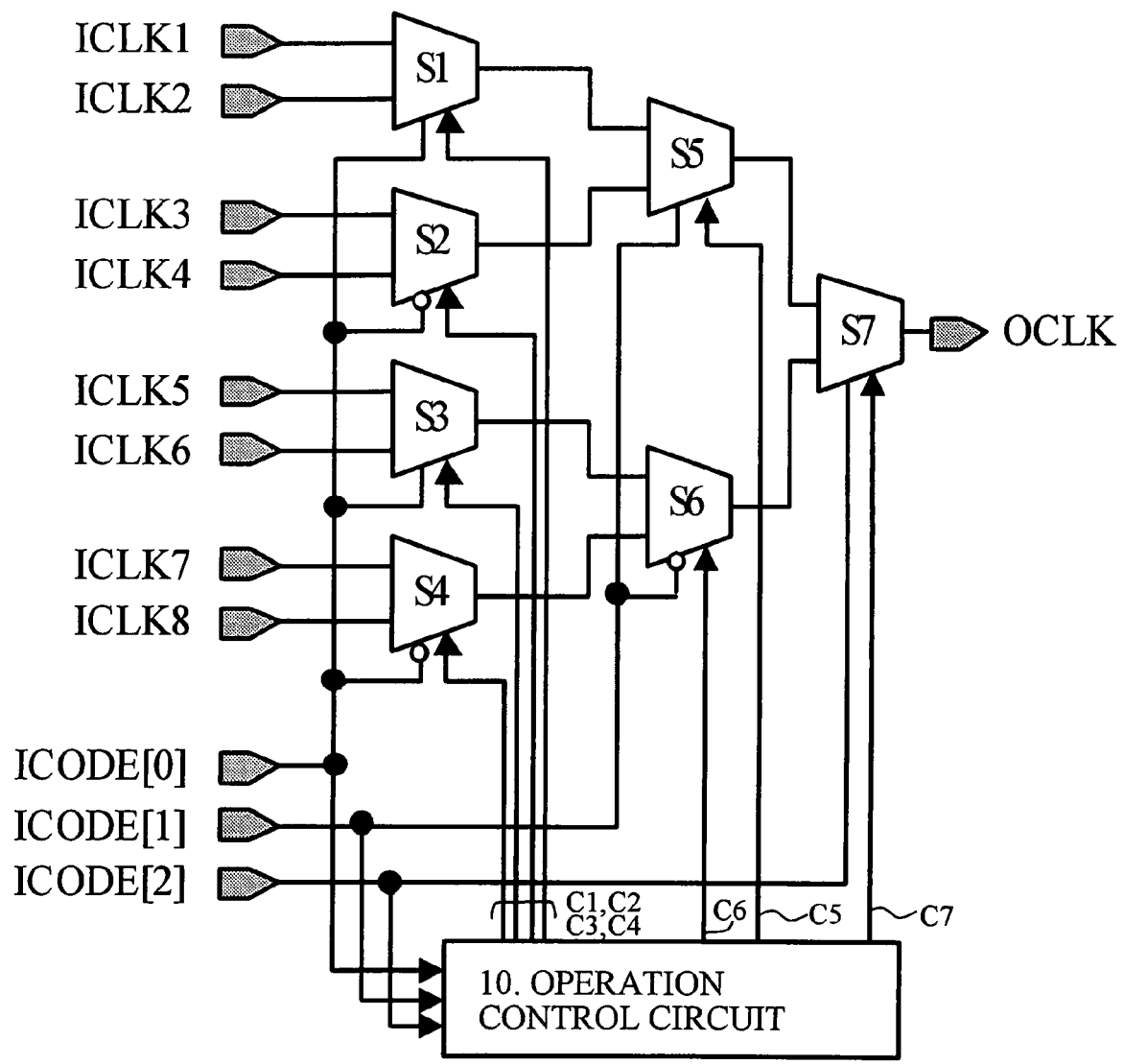
FIG. 8 is a clock switching circuit diagram in the present embodiment.

FIG. 8 is a clock switching circuit diagram for this embodiment. This clock switching circuit, similarly to the clock switching circuit of FIG. 1, selects and outputs as the output clock OCLK one of the eight input clocks ICLK1 to 8 with different phases. To this end, there are four selectors S1 to S4 in the first layer, two selectors S5, S6 in the second layer, and one selector S7 in the third layer; based on the three-bit selection signals ICODE[2:0], each of the selectors selects one of the two input clock signals. The relation between selection signals and selectors is the same as in FIG. 1; clock switching operation is the same as in FIG. 3.

The clock switching circuit of this embodiment has an operation control circuit 10 which, in response to the states of selection signals ICODE, generates operation control signals C1 to C7 to execute control to set each of the selectors into the active state or the sleep state. The operation control signals C1 to C7 are supplied to the respectively selectors S1 to S7. Based on selection signals, the operation control circuit 10 generates operation control signals C1 to C7 to set the necessary portion of selectors to the active state among the seven selectors, and to set the remaining selectors to the sleep state. By this means, selectors for which operation is unnecessary are set to the sleep state, so that overall power consumption can be reduced.

On the other hand, in the clock switching circuit of FIG. 1, all selectors perform switching upon switching of the selection signal by the internal latch circuits, to switch the output clock, so that power consumption becomes excessively high. In this embodiment, only the necessary selectors are set to the active state by the operation control circuit 10, and the remaining unnecessary selectors are set to the sleep state, so that power consumption can be reduced.

Figure 9:
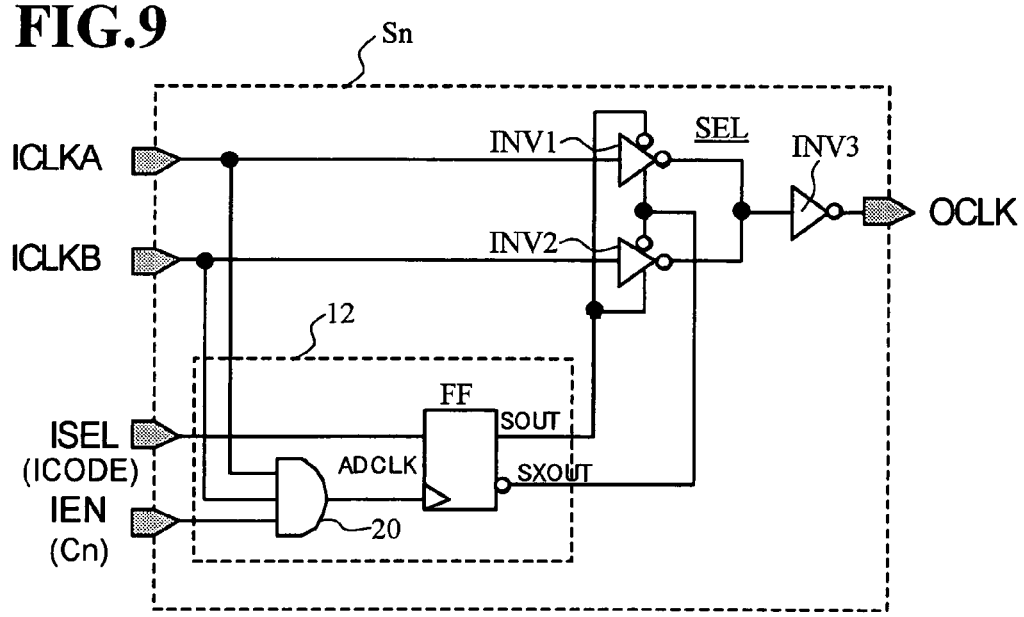
FIG. 9 shows the configuration of a selector in a clock switching circuit of in the present embodiment.

FIG. 9 shows the configuration of a selector in the clock switching circuit of this embodiment. Similarly to FIG. 4, this selector Sn has a switching control circuit 12 comprising an AND gate 20 and a flip-flop circuit FF. However, in addition to the input clocks ICLKA, ICLKB, an operation control signal IEN (Cn in FIG. 8) from the operation control circuit 10 is also supplied to the AND gate 20. Hence if the operation control signal IEN is in the active state (H level), when both clocks ICLKA and ICLKB are at the H level, the output clock ADCLK rises to the H level, and so the selection signal ISEL is latched by the flip-flop circuit FF, and the selector circuit SEL is controlled to perform switching. That is, the selector Sn is controlled to set the active state, and the latch operation of the selection signal switching and the switching operation are performed, resulting in electrical current consumption.

On the other hand, when the operation control signal IEN is in the sleep state (L level), the output-ADCLK of the AND gate 20 is maintained at L level regardless of the states of the two clocks ICLKA, ICLKB, and so the flip-flop circuit FF does not latch the selection signal ISEL, and the previously latched state is maintained. That is, the selector circuit is not subjected to switching control and remains in the sleep state, and the clock selection state is maintained without change.

In a case in which a NOR gate is provided instead of the AND gate 20, and the selection signal is latched by the flip-flop when both clocks ICLKA, ICLKB are at L level, the L level of the operation control signal IEN (Cn) corresponds to the active state, and the H level to the sleep state.

Figure 10:
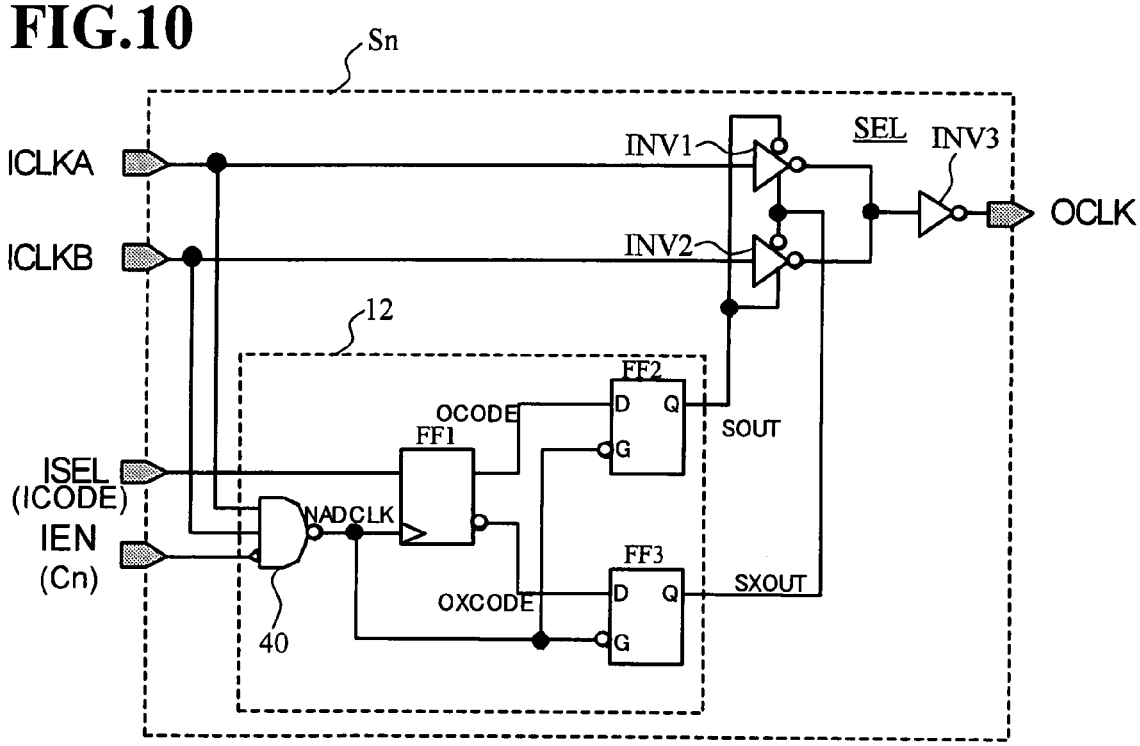
FIG. 10 shows another selector configuration in a clock switching circuit of the present embodiment.

FIG. 10 shows a selector configuration in a clock switching circuit of this embodiment. Similarly to FIG. 6, this selector Sn has a switching control circuit 12 comprising a NAND gate 40, flip-flop circuit FF1, and flip-flop circuits FF2, FF3. However, in addition to the input clocks ICLKA, ICLKB, the operation control signal IEN (Cn in FIG. 8) from the operation control circuit 10 is also supplied to the NAND gate 40. Hence if the operation control signal IEN is in the active state (H level), when both the clocks ICLKA, ICLKB are at H level and either one then goes to L level, the output clock NADCLK rises, and so the flip-flop circuit FF1 latches the selection signal ISEL. Thereafter, when both clocks ICLKA, ICLKB go to H level, the output clock NADCLK falls to L level, and so the outputs OCODE, OXCODE of the flip-flop circuit FF1 are latched by the flip-flop circuits FF2, FF3, and the selector circuit SEL undergoes switching control. That is, the selector Sn is set to the active state, and in response to switching of the selection signal a latching operation and switching operation are performed, resulting in electrical current consumption.

On the other hand, when the operation control signal IEN is in the sleep state (L level), the output NADCLK of the NAND gate 40 is maintained at H level regardless of the states of the two clocks ICLKA, ICLKB, so that the flip-flop circuits FF1, FF2, FF3 do not perform latching operations, and the previously latched state is maintained. That is, the selector circuit SEL does not undergo switching control, but is set to the sleep state, and the clock selection state is maintained without change.

Figure 11:
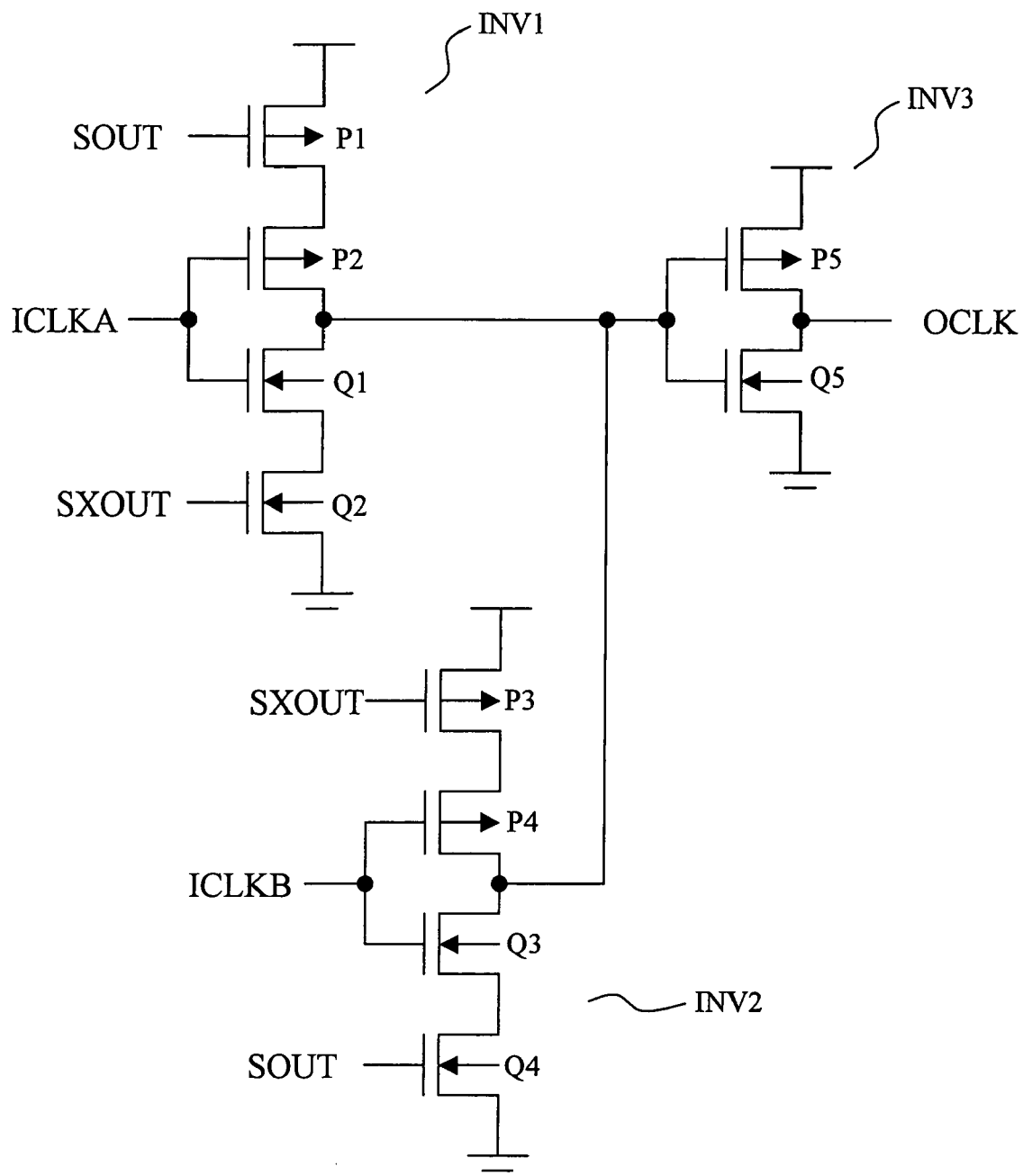
FIG. 11 is a circuit diagram for a selector circuit.

FIG. 11 is a circuit diagram of a selector circuit. The selector circuit SEL within the selector Sn in FIG. 9 and FIG. 10 comprises three inverters INV1, 2, 3. In FIG. 11, the specific circuit diagrams of these three inverters INV1, 2, 3 are shown. The inverter INV1 comprises P-channel transistors P1, P2 and N-channel transistors Q1, Q2; the complementary signals SOUT, SXOUT of the selection signal ISEL latched by the switching control circuit 12 are respectively supplied to the transistors P1, Q2, and the input clock ICLKA is supplied to the transistors P2, Q1. The inverter INV2 comprises P-channel transistors P3, P4 and N-channel transistors Q3, Q4; the complementary signals SXOUT, SOUT of the selection signal ISEL latched by the switching control circuit 12 are respectively supplied to transistors P3, Q4, and the input clock ICLKB is supplied to transistors P4, Q3. And, the inverter INV3 comprises a P-channel transistor P5 and an N-channel transistor Q5; the outputs of the inverters INV1, INV2 are supplied to the gates of these transistors.

Hence when the complementary signals SOUT, SXOUT are at H and L levels, the inverter INV2 is active and the clock ICLKB is selected, and when the complementary signals SOUT, SXOUT are at L and H levels, the inverter INV1 is active and the clock ICLKA is selected. As explained above, in the sleep state the selection signal is not latched by the flip-flop, and so switching between the inverters INV1, 2 does not occur, and power consumption can be reduced.

In FIG. 11, if the inputs of the complementary signals SOUT, SXOUT of the selection signal ISEL to the inverters INV1, INV2 are reversed, then the selector circuit performs clock selection operations based on inverted logic. Hence whether selection signals are supplied using positive logic or using negative logic means a difference in the polarity of the input of the complementary signals SOUT, SXOUT to the inverters INV1, INV2.

Figure 12:
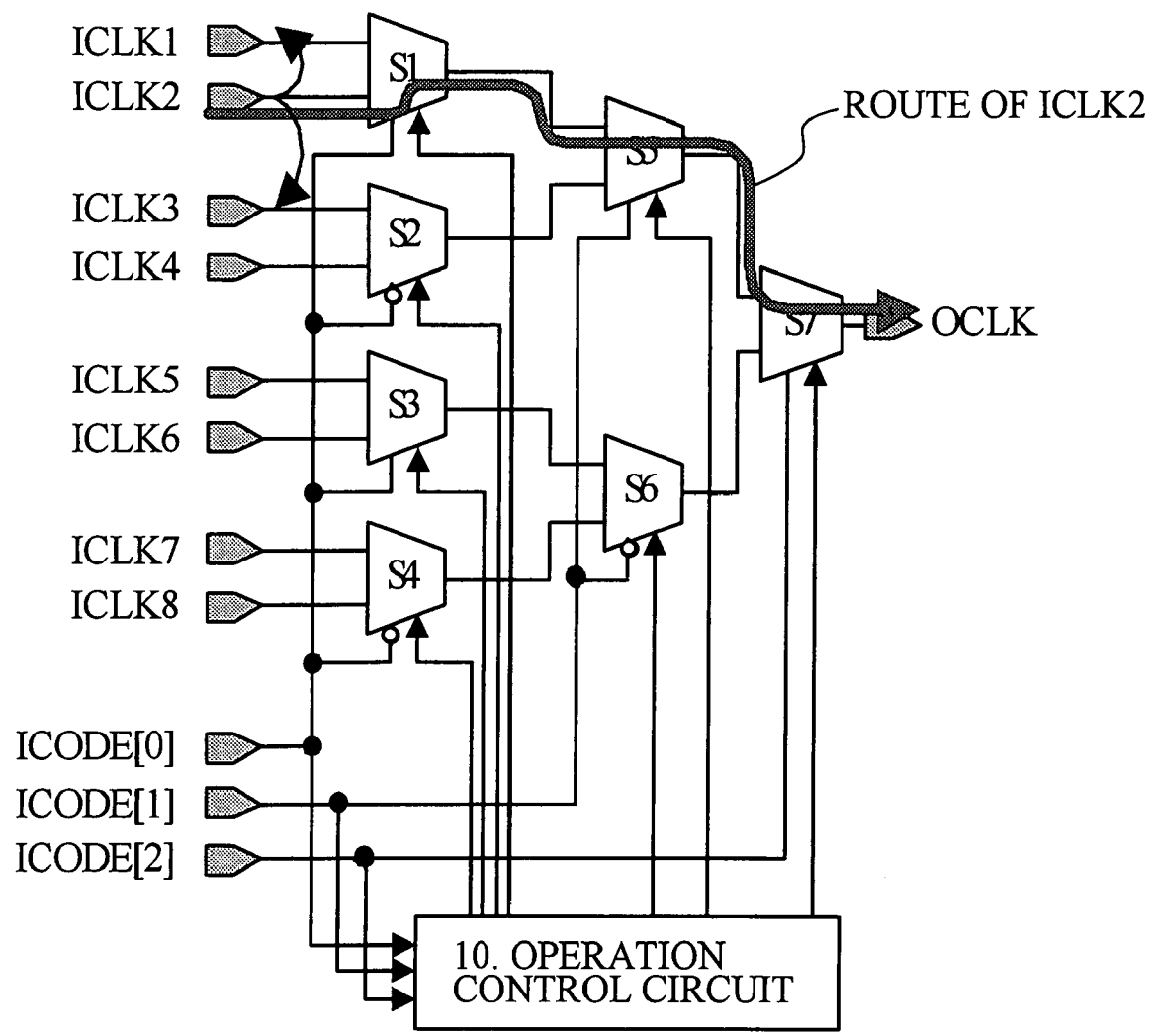
FIG. 12 is used to explain a selector necessary for clock switching which has been made active.

FIG. 12 is used to explain selectors necessary for clock switching which are made active. In FIG. 12, a case is shown in which switching is performed from the selected input clock ICLK2 to one of the adjacent input clocks ICLK1 or ICLK3. As shown in FIG. 3, the selection signal ICODE[2:0] to select the input clock ICLK2 is "001", and the input clock ICLK2 is output as the output clock OCLK via the route indicated by the bold line in FIG. 9.

From this state, when switching the selection code ICODE [2:0] to "000" so as to switch to the input clock ICLK1, it is sufficient that selector S1 perform switching among the selectors in the first layer which are subjected to switching control by switching of the lowermost bit ICODE[0], and there is no need for switching of the selectors S2, S3 or S4. Conversely, when, starting in this state, selection signal ICODE[2:0] is switched to "011" so as to switch to the input clock ICLK3, among the second layer selectors subjected to switching control by switching of the second-bit ICODE[1], it is sufficient for selector S5 to perform switching, and switching by selector S6 is not necessary. This can also be seen from the switching selectors in FIG. 3.

Conversely, when, from the state in which input clock ICLK1 or ICLK3 is selected, switching to input clock ICLK2 is performed, if selector S1 which is necessary for switching from input clock ICLK1 and selector S5 which is necessary for switching from input clock ICLK3 are in the active state, then switching from either input clock ICLK1 or ICLK3 to input clock ICLK2 can be accommodated, as is clear from FIG. 3. Hence when generating operation control signals C1 to C7 according to the selection signal ICODE, at a minimum it is necessary that the operation control signals C1, C5 become in the active state (H level) for a selection signal "001" selecting the input clock ICLK2.

Similarly, as shown in FIG. 3, for a selection signal "000" selecting input clock ICLK1, the operation control signals C1, C7 are set to the active state (H level) in order to set the selectors S1, S7 in active. The minimum operation control signals to set the active state in the cases of other selection signals can also be ascertained from FIG. 3.

FIG. 13 is a table showing the relation between selection signals and selector operation states in the clock switching circuit of this embodiment. In this example, "A" indicates an active state which at a minimum is necessary for clock switching, and otherwise the sleep state "S" is set. Hence the operation states for each selector coincide with the states of the operation control signals supplied to each selector.

As explained above, the clock switching circuit switches in order between the input clocks ICLK1 to 8 with eight-phases. Hence if a reset operation is performed to temporarily set all selectors to the active state, then the selection state corresponding to the initial-state selection signal is set for each selector. Thereafter, switching is repeated to one of the input clocks adjacent to the input clock corresponding to the initial-state selection signal. Hence after the reset operation, it is sufficient to set to the active state only the selectors which are the minimum necessary for the respective selection signals, as explained above. According to the example of FIG. 13, only two selectors among the seven selectors are set to the active state, and the remaining selectors are set to the sleep state, so that the operating ratio is 2/7, and a substantial reduction in power consumption is possible.

When, as in FIG. 13, control is executed to set selectors to the active state with a 2/7 operating ratio, if some type of noise during clock switching operation causes a change in any of the selectors, and the selector is held in the sleep state, then it is anticipated that the correct selection state corresponding to the selection signal may not be maintained. In order to avoid such a situation, in addition to the two minimum necessary selectors of FIG. 13, all three selectors (selectors in three layers) connecting the input terminal of the input clock selected by the selection signal with the output terminal may be set to the active state. Hence in this case, for a selection signal "000" which selects input clock ICLK1, the selectors S1, S5, S7 are set to the active state. For other selection signals also, three selectors are similarly set to the active state.

FIG. 14 is another table showing the relation between selection signals and selector operation states in the clock switching circuit of this embodiment. In this example, in addition to the two selectors which at a minimum are necessary for clock switching based on the same approach as in FIG. 13, the three selectors on the route of the selected input clock are also set to the active state in order to implement the above-described noise countermeasure. Further, in consideration of switching to the two candidate input clocks to be selected next from the selected input clock, in FIG. 14 the three selectors on the routes of the two input clocks which are the next selection candidates are also set to the active state.

For example, for a selection signal "000" to select input clock ICLK1, in addition to the selectors S1, S5, S7 on the route of clock ICLK1, the selectors S4, S6 on the route for the next selection candidate clock ICLK8 are also set to active. The other next selection candidate clock ICLK2 is on the same route as clock ICLK1, and so it is sufficient to set the selectors S1, S5, S7 to the active state.

Similarly for a selection signal "010" which selects clock ICLK4, in addition to the selectors S2, S5, S7 on the route of clock ICLK4, the selectors S3, S6 on the route of next selection candidate clock ICLK5 are set to the active state. And for a selection signal "011" to select clock ICLK3, in addition to the selectors S2, S5 on the route of clock ICLK3, selector S1 on the route of next selection candidate clock ICLK2 is also set to the active state. Similar circumstances apply to a selection signal "101" to select clock ICLK7.

However, selector S7 is set to the active state in cases in which there is a possibility of switching control when switching to the next selection candidate (ICLK1, 4, 5, 8), but is set to the sleep state in cases in which there is no possibility of switching control (ICLK2, 3, 6, 7).

In FIG. 14, if the setting selector S7 is set to the active state for selection signals to select clocks ICLK2, 3, 6, 7, selection operations can be made more impervious to noise.

Figure 15:
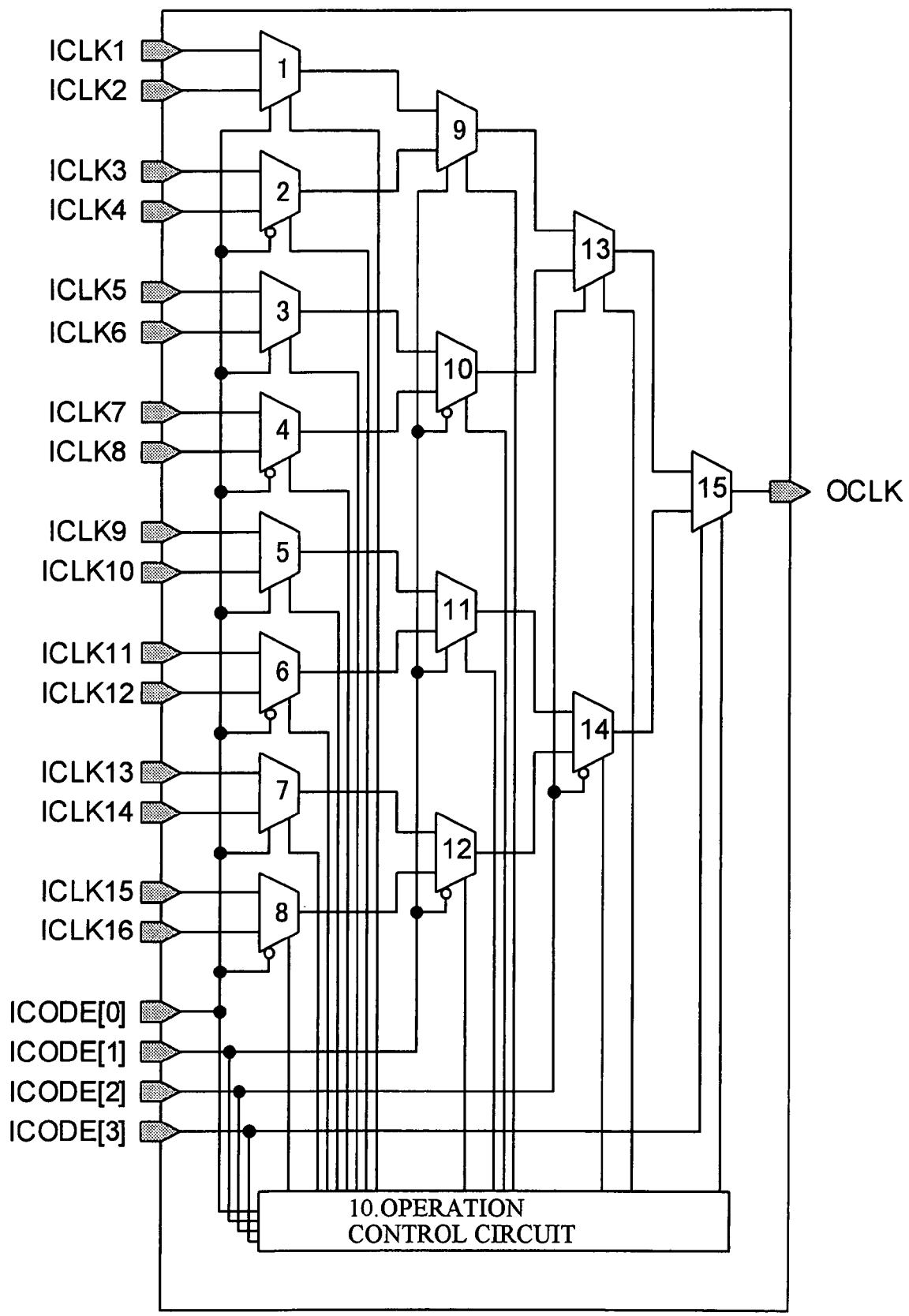
FIG. 15 is a diagram of a clock switching circuit corresponding to a 16-phase input clock in the present embodiment.

FIG. 15 is a diagram of a clock switching circuit corresponding to 16-phase input clocks in this embodiment. One clock signal-among the input clocks ICLK1 to 16 is selected by a selector group (15 selectors) constructed in four layers, controlled by four-bit selection signals ICODE[3:0]. By means of Gray code selection signals, the input clocks are switched in order. Further, an operation control circuit 10 which executes control to set each selector to the active state or the sleep state is provided. The operation control circuit 10 supplies operation control signals to each of the 15 selectors. The construction of each selector is the same as in FIG. 9 or FIG. 10.

FIG. 16 is a table indicating the input clocks, selection signals, and the selectors which at a minimum are necessary for switching corresponding to the selection signals, in the clock switching circuit of FIG. 15. The figure corresponds to FIG. 3. The four-bit selection signals to select each of the input clocks ICLK1 to 16 are indicated.

As shown in FIG. 16, for a selection signal "0001" to select input clock ICLK2, it is sufficient to set to the active state the selectors S1, S9 necessary to switch from the previous selected input clock ICLK1 or ICLK3 to ICLK2. Similarly for a selection signal "0010" to select input clock ICLK4, it is sufficient to set to the active state the minimum necessary selectors S2, S13. According to this approach, in a clock switching circuit for input clock signals with 16-phases, the selectors which at minimum must be set to the active state will be obvious to a person skilled in the art. In this way, a table similar to that in FIG. 13 can be obtained for the circuit of FIG. 15.

Further, as explained for a switching circuit for input clocks with eight-phases, the four selectors on the route of the selected input clock may all be set to the active state. And, as explained using FIG. 14, the selectors for next selection candidates may also be put into the active state. By setting more selectors to the active state, erroneous operation due to noise can be avoided, but the operating ratio is increased, detracting from efforts to reduce power consumption.

In the above, clock switching circuits have been explained for the cases of eight-phases and 16-phases; however, this embodiment can also be applied to clock switching circuits which select one clock from among input clocks with a greater number of $2^N$-phases. In this case, selectors are provided in each of the first to Nth layers, and a total of $2^N-1$ selectors are provided. The selection signal has N-bits, and is supplied to the selectors in each layer using positive logic or negative logic.

What is claimed is:

1. A clock switching circuit, in which one clock signal is selected from $2^N$-phase input clock signals with the same frequency but with each shifted in phase (where N is an integer equal to or greater than 3), based on an N-bit selection signal, and is output as an output clock signal, the clock switching circuit comprising:

a selector group having $2^N-1$ selectors each of which selects and outputs one clock signal from two input clock signals; and an operation control circuit which generates $2^N-1$ operation control signals to execute control to set said $2^N-1$ selectors into an active state or into a sleep state, wherein said selector group comprises:

a first layer, having first to $2^{N-1}$th selectors, each of which input two input clocks among said input clocks and selects and outputs one of said two input clocks, a second layer, having $2^{N-1}+1$th to $2^{N-1}$th$+2^{N-2}$th selectors, each of which input the output clocks of the two selectors of said first layer as input and selects and outputs one of said two clocks, and 3rd to Nth layers (where in this case N is equal to or greater than 4), in which said Nth layer has the $2^N-1$th selector, which input as input clocks the output clocks of the two selectors in the N–1th layer and selects and outputs one of said two clocks, and wherein a first selection signal is supplied to said first layer selectors using positive logic or negative logic, a second selection signal is supplied to said second layer selectors using positive logic or negative logic, third to N–1th selection signals are similarly supplied to the third to N–1th layer selectors using positive logic or negative logic, and an Nth selection signal is supplied to the selector of said Nth layer, and said operation control circuit, according to the state of said N-bit selection signal, generates said operation control signals to set a portion of said $2^N-1$ selectors to an active state, and to set the remaining selectors to a sleep state.

2. The clock switching circuit according to claim 1, wherein said operation control circuit generates active state operation control signals for at least two selectors necessary for switching to the selected input clock from two adjacent input clocks, among the N selectors in N layers provided from the input terminal of said selected input clock to the output terminal of said output clock.

3. The clock switching circuit according to claim 1, wherein said operation control circuit generates active state operation control signals for, at least, selectors in N layers provided from the input terminal of said selected input clock to the output terminal of said output clock, and selectors in N layers provided from the input terminals of adjacent next-selection candidate input clocks, to which switching is possible from said selected input clock, to the output terminal of said output clock.

4. The clock switching circuit according to claim 1, wherein said operation control circuit generates active state operation control signals for, at least, two selectors necessary for switching to the selected input clock from two adjacent input clocks among the selectors in N layers provided from the input terminal of said selected input clock to the output terminal of said output clock, and selectors in N layers provided from the input terminals of adjacent next-selection candidate input clocks to which switching is possible from said selected input clock, to the output terminal of said output clock.

5. The clock switching circuit according to claim 1, wherein each of said first to $2^N-1$th selectors switches to one of the two input clocks according to said selection signal when said two clocks are at the same logic level, performs the switching operation when said operation control signal is at the active state, and does not perform the switching operation when said operation control signal is at the sleep state.

6. The clock switching circuit according to claim 5, wherein each of said first to $2^N-1$th selectors has a switching control circuit having a flip-flop which latches said selection signal when the two input clocks are at the same logic level, and switches to one of said two clocks in response to the latched output signal of the flip-flop, and wherein said flip-flop latches said selection signal when said operation control signal is at the active state, and does not latch said selection signal when said operation control signal is at the sleep state.

7. The clock switching circuit according to claim 1, wherein said selection signals are supplied using either positive logic or negative logic to the odd-numbered selectors of said first to $2^N-1$th selectors, and said selection signals are supplied using the other logic type among positive logic or negative logic to the even-numbered selectors.

8. The clock switching circuit according to claim 1, wherein said first to Nth selection signals are Gray codes which select said first to $2^N$th input clocks.

9. A clock switching circuit, in which one clock signal is selected from $2^N$-phase input clock signals with the same frequency but with each shifted in phase (where N is an integer equal to or greater than 3), based on an N-bit selection signal, and is output as an output clock signal, the clock switching circuit comprising:

a selector group having $2^N-1$ selectors each of which selects and outputs one clock signal from two input clock signals; and an operation control circuit which generates $2^N-1$ operation control signals that are supplied to said respective $2^N-1$ selectors and execute control to set the selectors into an active state or into a sleep state, wherein said selector group comprises:

a first layer, having $2^N-1$ selectors, each of which input two input clocks among said input clocks and selects and outputs one of said two input clocks;

a second layer, having $2^N-2$ selectors, each of which input the output clocks of the two selectors of said first layer as input and selects and outputs one of said two output clocks, further, ith layers (where i=3 to N–1), having $2^{N-i}$ selectors, each of which input two-selector output clocks of the i–1th layer as input and selects and outputs one of said two clocks, and an Nth layer, having one selector, which input as input the output clocks of the two selectors in the N–1th layer and selects and outputs one of said two output clocks, and wherein said first to Nth selection signals are supplied to said first to Nth layer selectors respectively using positive logic or negative logic, and in response to switching of one selection signal among the first to Nth selection signals, switching is performed from the selected input clock to one of two adjacent input clocks to which switching is possible, and said operation control circuit, in response to the state of said N-bit selection signal, generates said operation control signals to set a portion of said $2^N-1$ selectors to an active state, and to set the remaining selectors to a sleep state.

10. The clock switching circuit according to claim 9, wherein said operation control circuit generates active state operation control signals for at least two selectors necessary for switching to the selected input clock from two adjacent input clocks, among the N selectors in N layers provided from the input terminal of said selected input clock to the output terminal of said output clock.

11. A clock switching circuit, in which one clock signal is selected from 8-phase input clock signals with the same frequency but with each shifted in phase, based on a selection signal of at least three bits, and is output as an output clock signal, the clock switching circuit comprising:

a selector group having at least seven selectors each of which selects and outputs one clock signal from two input clock signals; and an operation control circuit which generates seven operation control signals to execute control to set said seven selectors into an active state or into a sleep state, wherein said selector group comprises at least:

a first layer, having first to fourth selectors, each of which input two input clocks among said input clocks and selects and outputs one of said two clocks, a second layer, having fifth and sixth selectors, each of which input the output clocks of the two selectors of said first layer and selects and outputs one of said two output clocks, and a third layer, having a seventh selector, which input the output clocks of said fifth and sixth selectors and selects and outputs one of said two output clocks, and wherein a first selection signal is supplied to said first layer selectors using positive logic or negative logic, a second selection signal is supplied to said second layer selectors using positive logic or negative logic, and a third selection signal is supplied to the third layer selector using positive logic or negative logic, and said operation control circuit, in response to the state of said three-bit selection signal, generates said operation control signals to set a portion of said seven selectors to an active state, and to set the remaining selectors to a sleep state.

12. The clock switching circuit according to claim 11, wherein said operation control circuit generates active state operation control signals for at least two selectors necessary for switching to the selected input clock from two adjacent input clocks, among the three selectors in three layers provided from the input terminal of said selected input clock to the output terminal of said output clock.

13. The clock switching circuit according to claim 11, wherein said operation control circuit generates active state operation control signals for, at least, selectors in three layers provided from the input terminal of said selected input clock to the output terminal of said output clock, and selectors in three layers provided from the input terminals of adjacent next-selection candidate input clocks, to which switching is possible from said selected input clock, to the output terminal of said output clock.

14. The clock switching circuit according to claim 11, wherein said operation control circuit generates active state operation control signals for, at least, two selectors necessary for switching to the selected input clock from two adjacent input clocks among the selectors in three layers provided from the input terminal of said selected input clock to the output terminal of said output clock, and for selectors in three layers provided from the input terminals of adjacent next-selection candidate input clocks to which switching is possible from said selected input clock, to the output terminal of said output clock.

15. The clock switching circuit according to claim 11, wherein each of said first to seventh selectors switches to one of the two input clocks according to said selection signal when said two clocks are at the same logic level, performs the switching operation when said operation control signal is at the active state, and does not perform the switching operation when said operation control signal is at the sleep state.

16. A clock switching circuit, in which one clock signal is selected from 8-phase input clock signals with the same frequency but with each shifted in phase, based on a three-bit selection signal, and is output as an output clock signal, the clock switching circuit comprising:

a selector group having seven selectors each of which selects and outputs one clock signal from two input clock signals; and an operation control circuit which generates seven operation control signals that are supplied to said respective seven selectors and execute control to set the selectors into an active state or into a sleep state, wherein said selector group comprises:

a first layer, having first to fourth selectors, each of which input two input clocks among said input clocks and selects and outputs one of said two input clocks, a second layer, having fifth and sixth selectors, each of which input the output clocks of the two selectors of said first layer and selects and outputs one of said two output clocks, and a third layer, having a seventh selector, which input the output clocks of the fifth and sixth selectors and selects and outputs one of said two output clocks, and wherein said first to third selection signals are supplied to said first to third layer selectors respectively using positive logic or negative logic, and in response to switching of one selection signal among the first to third selection signals, switching is performed from the selected input clock to one of two adjacent input clocks to which switching is possible, and said operation control circuit, in response to the state of said three-bit selection signal, generates said operation control signals to set a portion of said seven selectors to an active state, and to set the remaining selectors to a sleep state.

17. The clock switching circuit according to claim 16, wherein said operation control circuit generates active state operation control signals for at least two selectors necessary for switching to the selected input clock from two adjacent input clocks, among the three selectors in three layers provided from the input terminal of said selected input clock to the output terminal of said output clock.

* * * * *